(12) United States Patent
Palusa et al.

(10) Patent No.: US 9,215,106 B2
(45) Date of Patent: Dec. 15, 2015

(54) METHOD AND APPARATUS FOR PRE-CURSOR INTERSYMBOL INTERFERENCE CORRECTION

(71) Applicant: LSI Corporation, San Jose, CA (US)

(72) Inventors: Chaitanya Palusa, Fremont, CA (US); Adam B. Healey, Newburyport, MA (US); Hiep T. Pham, San Jose, CA (US); Volodymyr Shvydun, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/221,968

(22) Filed: Mar. 21, 2014

(65) Prior Publication Data

US 2015/0236875 A1 Aug. 20, 2015

Related U.S. Application Data

(60) Provisional application No. 61/940,553, filed on Feb. 17, 2014.

(51) Int. Cl.
*H04L 25/03* (2006.01)
*H03M 1/00* (2006.01)
*H04L 1/06* (2006.01)

(52) U.S. Cl.
CPC ............ *H04L 25/03057* (2013.01); *H03M 1/00* (2013.01); *H03H 2218/06* (2013.01); *H03M 2201/4135* (2013.01); *H04L 1/06* (2013.01)

(58) Field of Classification Search
None
See application file for complete search history.

(56) References Cited

U.S. PATENT DOCUMENTS

| | | | |
|---|---|---|---|
| 6,393,068 B1 * | 5/2002 | Rupp | 375/326 |
| 8,611,483 B2 | 12/2013 | Zhu et al. | |
| 2002/0122503 A1 * | 9/2002 | Agazzi | 375/316 |
| 2008/0069199 A1 * | 3/2008 | Chen et al. | 375/233 |
| 2009/0327385 A1 * | 12/2009 | Groezing et al. | 708/316 |
| 2011/0193732 A1 * | 8/2011 | Sestok et al. | 341/118 |

* cited by examiner

*Primary Examiner* — Leon-Viet Nguyen
(74) *Attorney, Agent, or Firm* — Suiter Swantz pc llo

(57) ABSTRACT

A multi-stage system and method for correcting intersymbol interference is disclosed. The system includes a first estimation module configured to sample an input signal to produce a first set of estimated data bits. The system also includes a second estimation module configured to sample the input signal phase shifted by a predetermined phase shift unit to produce a second set of estimated data bits, wherein the second set of estimated data bits are produced at least partially based on the first set of estimated data bits and at least one pre-cursor coefficient.

20 Claims, 5 Drawing Sheets

METHOD AND APPARATUS FOR PRE-CURSOR INTERSYMBOL INTERFERENCE CORRECTION

CROSS-REFERENCE TO RELATED APPLICATIONS

The present application claims the benefit under 35 U.S.C. §119(e) of U.S. Provisional Application Ser. No. 61/940,553, filed Feb. 17, 2014. Said U.S. Provisional Application Ser. No. 61/940,553 is hereby incorporated by reference in its entirety.

TECHNICAL FIELD

The present invention relates to the field of communication systems and particularly to serial communication systems.

BACKGROUND

Data going through a channel in a serial communication link is subjected to distortion associated with the interference between symbols. As a bit that is transmitted as a pulse makes its way to a receiver through the communication channel, the pulse spreads itself out by the time it reaches the receiver and distorts its adjacent bits. This phenomenon of distortion is referred to as intersymbol interference, and commonly known by the acronym of ISI.

There are two components of intersymbol interference: post-cursor intersymbol interference and pre-cursor intersymbol interference. The distortion due to previous bits on the subsequent bits is referred to as post-cursor intersymbol interference and the distortion on the previous bits from the subsequent bits is referred to as pre-cursor intersymbol interference.

SUMMARY

Accordingly, an embodiment of the present disclosure is directed to a receiver. The receiver includes a first set of time-interleaved track-and-hold circuits configured to sample an input signal according to a first set of phase-shifted clock signals, and a first estimation module configured to estimate a value held at each of the first set of time-interleaved track-and-hold circuits to produce a first set of estimated data bits. The receiver also includes a second set of time-interleaved track-and-hold circuits configured to sample the input signal according to a second set of phase-shifted clock signals, wherein the second set of phase-shifted clock signals is the first set of phase-shifted clock signals shifted by a predetermined phase shift unit. A second estimation module is utilized to produce a second set of estimated data bits based on a value held at each of the second set of time-interleaved track-and-hold circuits, the first set of estimated data bits and at least one pre-cursor coefficient.

A further embodiment of the present disclosure is also directed to a communication apparatus. The communication apparatus includes a first estimation module configured to sample an input signal to produce a first set of estimated data bits, and a second estimation module configured to sample the input signal phase shifted by a predetermined phase shift unit to produce a second set of estimated data bits, wherein the second set of estimated data bits are produced at least partially based on the first set of estimated data bits and at least one pre-cursor coefficient.

An additional embodiment of the present disclosure is directed to a method for correcting intersymbol interference. The method includes: sampling an input signal utilizing a first set of track-and-hold circuits time-interleaved based on a first set of phase-shifted clock signals; estimating a value held at each of the first set of time-interleaved track-and-hold circuits to produce a first set of estimated data bits; sampling the input signal utilizing a second set of track-and-hold circuits time-interleaved based on a second set of phase-shifted clock signals, wherein the second set of phase-shifted clock signals is the first set of phase-shifted clock signals shifted by a predetermined phase shift unit; and producing a second set of estimated data bits based on a value held at each of the second set of time-interleaved track-and-hold circuits, the first set of estimated data bits and at least one pre-cursor coefficient.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Figure 1:
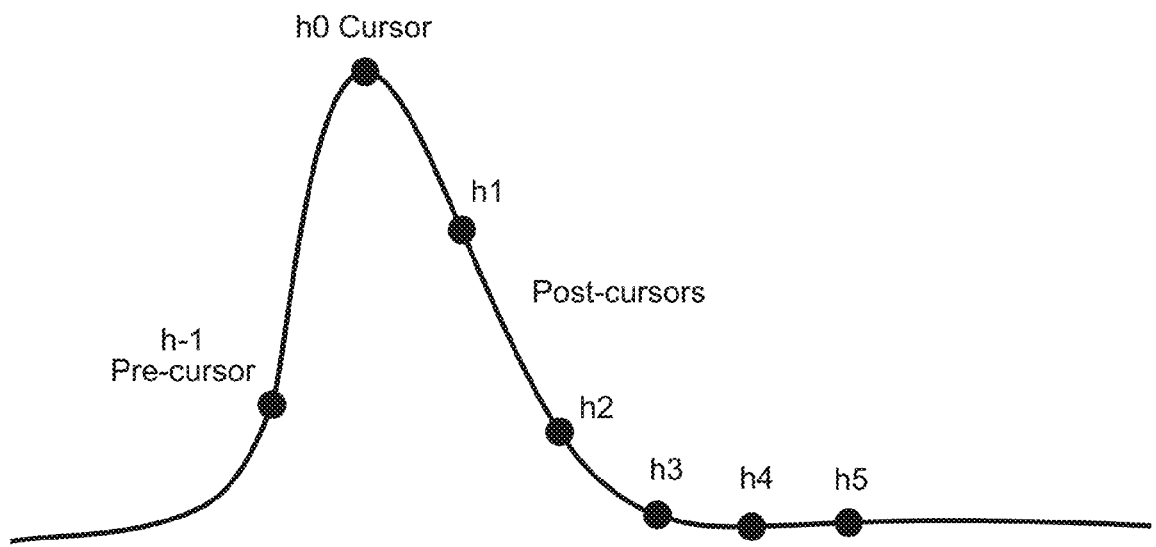
FIG. 1 is an illustration depicting intersymbol interference through an impulse response of a communication channel.

FIG. 1 is an illustration depicting pre-cursor intersymbol interference and post-cursor intersymbol interference through an impulse response of a communication channel. The peak of the impulse response is the main cursor ($h_0$) and corresponds to the point the bit is sampled in the receiver. Post-cursor intersymbol interference refers to the points along the impulse response that are unit intervals later in time from the main cursor and are denoted as $h_1$, $h_2$, $h_3$, etc. Pre-cursor intersymbol interference refers to the points along the impulse response that are unit intervals before in time from the main cursor and are denoted as $h_{-1}$, $h_{-2}$, etc.

Intersymbol interference causes degradation of the signal eye opening at the input of the receiver and in many cases, the eye is fully closed when the channel is long and/or the associated intersymbol interference is significant. The receiver is expected to equalize the input signal (i.e., to correct the intersymbol interference) to open the eye sufficiently for a clock data recovery (CDR) unit to sample the input eye in the open region in order to obtain error free data. In most traditional serializer-deserializer (SerDes) transceivers, the receiver only corrects the post-cursor intersymbol interference. However, as the data rates increase, the pre-cursor intersymbol interference is increasingly more significant and not correcting it would lead to diminished eye margins. Furthermore, there is a class of CDRs that rely on baud rate sampling that are very efficient and low power but require pre-cursor intersymbol interference correction for sampling in the center region of the eye opening. Such baud rate CDRs are inherently lower power as they do not require oversampling as is the case with bang-bang CDRs. The baud rate sampling is a much preferred option as the data rates increase because due to the difficulty of generating high speed oversampled clocks. Providing pre-cursor intersymbol interference correction is therefore a key enabler for utilizing low power baud rate CDRs.

In a traditional serializer-deserializer, pre-cursor correction is normally implemented inside the transmitter. In general, this correction through transmitter is coarse and there is no option to further tune inside the receiver for maximizing the eye margins. While it would be ideal to have pre-cursor correction inside the receiver, there is significant difficulty in implementing such a pre-cursor correction on the receiving side as it deals with intersymbol interference corrections related to subsequent (future) bits which are yet to be received.

Embodiments of the present disclosure are directed to cost effective implementations of intersymbol interference correction circuits in receivers capable of providing pre-cursor intersymbol interference corrections. Such pre-cursor intersymbol interference correction circuits are configured to generate reasonable estimates of incoming samples and utilize the samples as "future" bits to correct intersymbol interferences from "delayed" input signals. More specifically, a multi-stage interleaved track and hold front end is used to delay the incoming analog signal by few clock phases (i.e., acting as an analog flip-flop) in order to provide sufficient time to correct the intersymbol interferences associated with signal estimates of an earlier stage. Increasing the number of clock phases in the interleaved track and hold front end leads to increased timing margin to perform pre-cursor intersymbol interference correction going from one stage to another.

Figure 2:
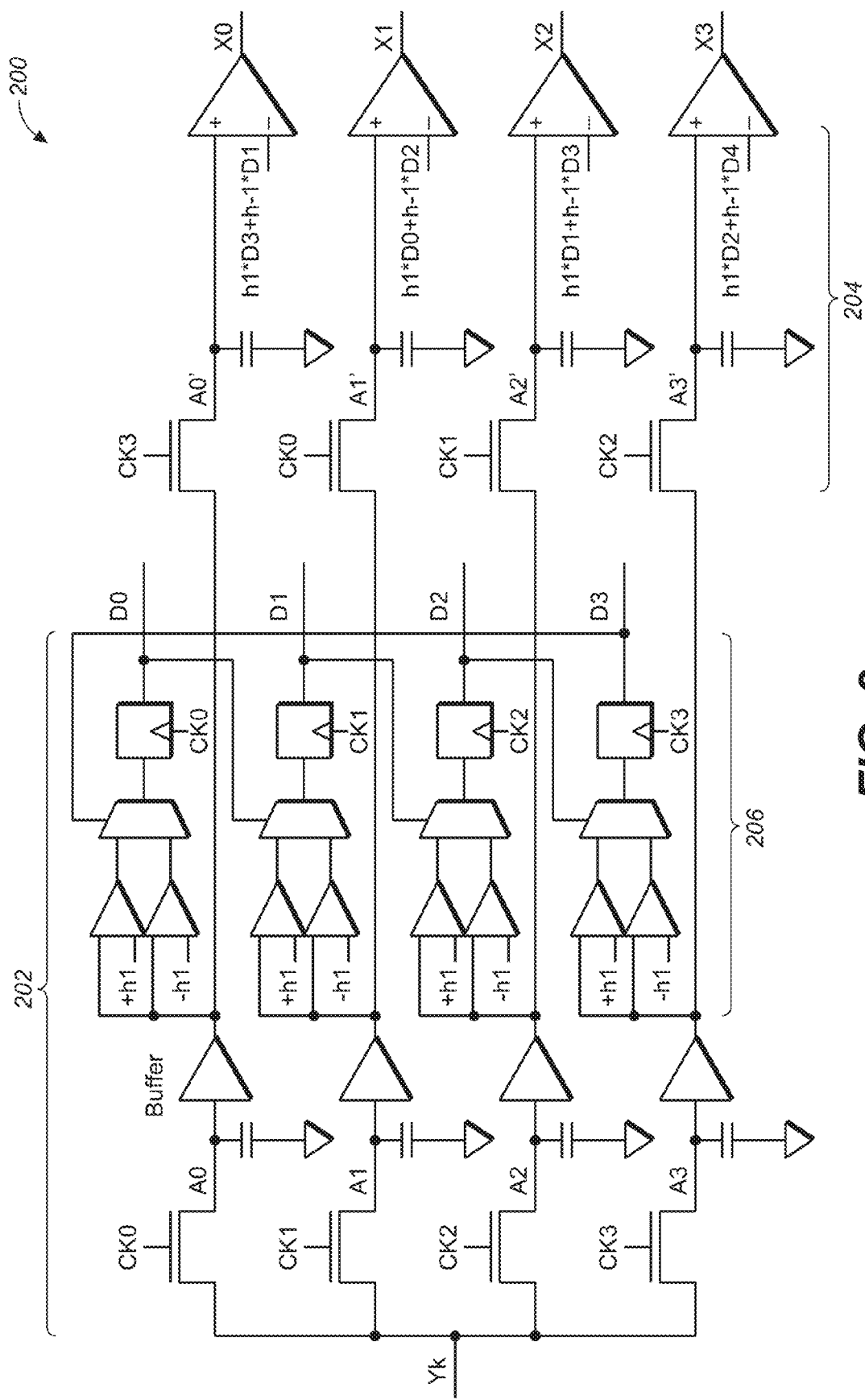
FIG. 2 is a schematic depicting an exemplary 2-stage 4-way interleaved intersymbol interference correction data path.

Referring to FIG. 2, a schematic depicting a pre-cursor correction circuit 200 with two stages of time-interleaved track and hold front end components is shown. In the embodiment depicted in FIG. 2, each stage utilizes a 4-way interleaved track and hold to sample the input signal to provide estimations. Such a configuration allows the data bit values estimated in the first stage 202 to be used as input for the second stage 204 estimation for further refinement. In addition, it is noted that the interleaving clock phases (denoted as CK0, CK1, CK2 and CK3) in the second stage 204 are shifted from the first stage 202 clock phases by one (1) unit of interval so as to provide a flip-flop type of operation, maximizing the time allowed for cursor correction operations from the first stage to the second stage.

Figure 3:
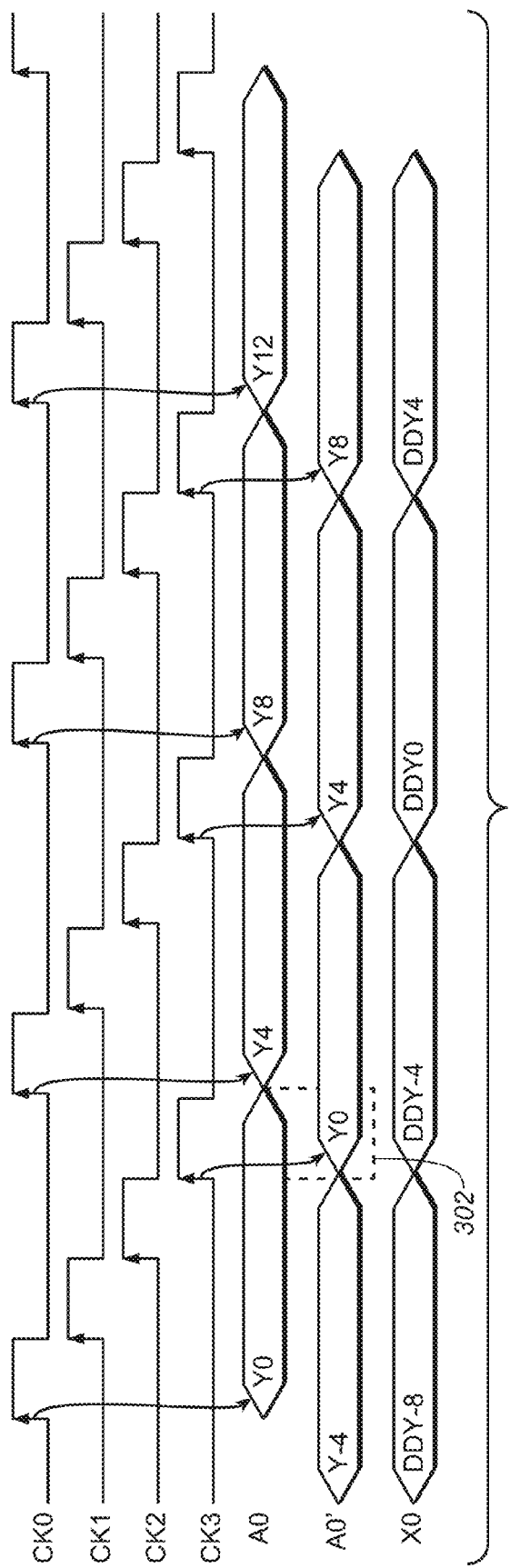
FIG. 3 is a timing diagram illustrating signals being processed by one of the interleaved branches depicted in FIG. 2.

More specifically, in the embodiment depicted in FIG. 2, the analog samples A0, A1, A2 and A3 latched by the 4-way interleaved track and hold in the first stage 202 are buffered, then followed by a second stage of 4-way interleaved track and hold 204 to produce A0', A1', A2' and A3'. As a result of interleaving, the staggered clock allows each signal to be held for 4 units of interval (N units for N-way interleaving, where N is the interleaving factor), providing more time for each signal to be processed. As illustrated in the timing diagram shown in FIG. 3 illustrating signals being processed by the top branch of FIG. 2, time distance from Ak to Ak' is (N−1) unit of interval for post-cursor correction and (N−3) unit of interval for pre-cursor correction. That is, utilizing the 2-stage 4-way interleaved track and hold front end with clock phase shift of 1 unit of interval between the two stages, 4−3=1 unit of interval is provided for pre-cursor correction. This 1 unit of interval provided for pre-cursor correction for Y0 is denoted as interval 302 in FIG. 3 as an example, where input Y0 is available in both latched samples A0 and A0'. This allows the pre-cursor correction circuit 200 to generate reasonable estimates of incoming samples to correct intersymbol interferences for X0. It is noted that all other interleaved input signals are processed in the same manner, with (N−3) unit of interval provided for pre-cursor correction.

It is contemplated that the estimation module utilized in the first stage 202 can be a simple slicer if the communication channel is relatively clean. Alternatively and/or additionally, decision equalizers can be used to improve the estimated results of the first stage 202. In one embodiment, the buffer block drives a parallel 1-tap unrolled decision feedback equalizer (DFE) 206 for calculation of D0, D1, D2 and D3 hard decisions as inputs to the second stage 204. It is contemplated that other types of equalizers can be utilized without departing from the spirit and scope of the present disclosure.

Figure 4:
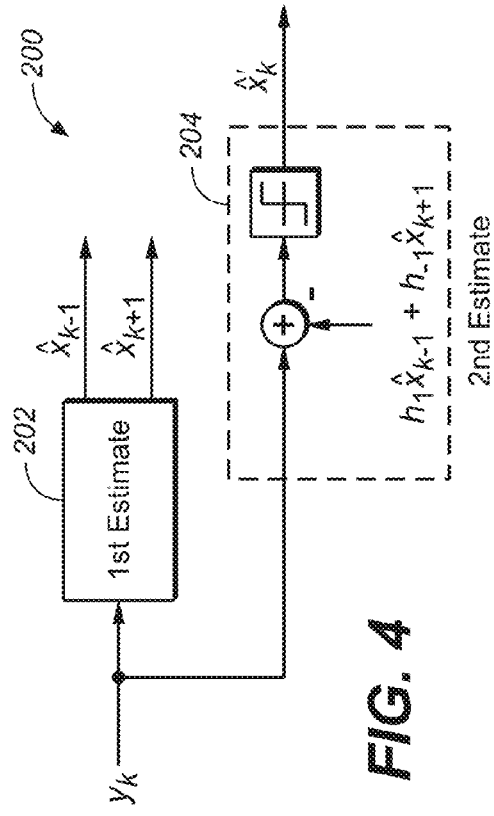
FIG. 4 is a block diagram depicting a generalized two-stage intersymbol interference correction circuit.

Referring now to FIG. 4, a block diagram depicting a generalized 2-stage intersymbol interference correction circuit 200 is shown. As previously described, each of the two stages 202 and 204 includes an N-way interleaved track and hold front end with clock phase shift of 1 unit of interval between the two stages. The first stage 202 utilizes a first estimation module to produce the estimated data bits (denoted as $\hat{x}_k$). The second stage 204 then refines the estimated data bits by taking pre- and/or post-cursor correction into consideration. More specifically, in the example depicted in FIG. 4, to provide pre-cursor correction for data bit $x_k$, the estimation module in the second stage 204 takes the predetermined pre-cursor coefficient $h_{-1}$ and the estimated value of a subsequent data bit $\hat{x}_{k+1}$ (estimated in the first stage) into consideration to calculate the estimation value $\hat{x}'_k$. It is contemplated that additional pre-cursor and/or post-cursor coefficients can also be taken into consideration in this second stage calculation without departing from the spirit and scope of the present disclosure. For instance, the example shown in FIG. 4 also takes into consideration the predetermined post-cursor coefficient $h_1$ and the estimated value of a previous data bit $\hat{x}'_k$ (also estimated in the first stage) for the estimation of $\hat{x}'_k$.

It is contemplated that while the examples above depict 4-way interleaving, the interleaving factor N is not limited to 4, N>4 interleaving would allow even more time for size/power efficient intersymbol interference processing in the output stage, at the expense of a larger number of interleaved branches.

Figure 5:
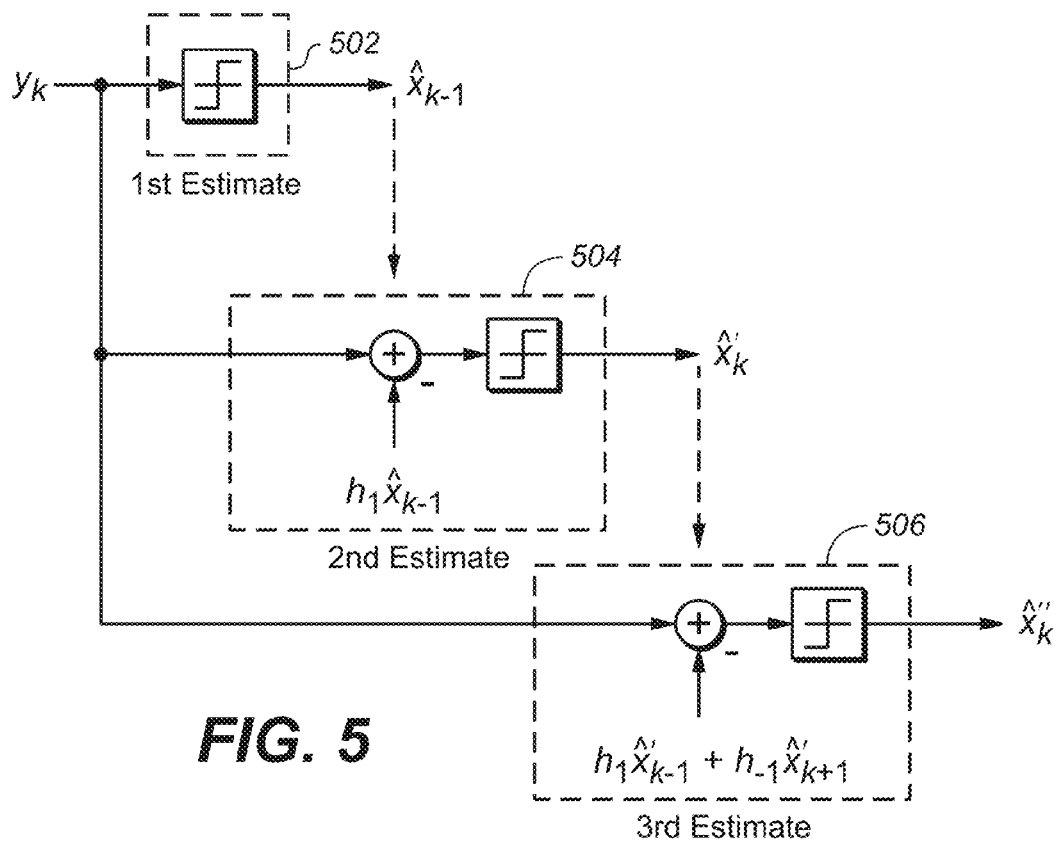
FIG. 5 is a block diagram depicting a three-stage intersymbol interference correction circuit.
Figure 6:
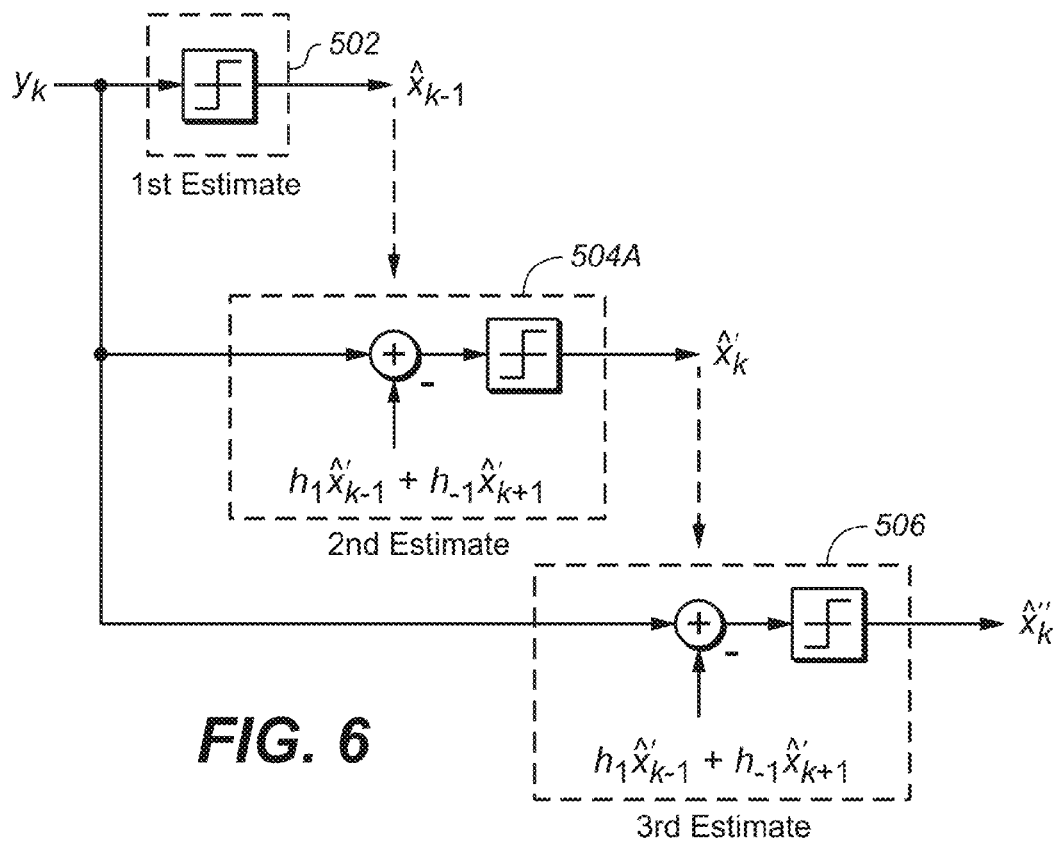
FIG. 6 is a block diagram depicting an alternative three-stage intersymbol interference correction circuit.

It is also contemplated that pre-cursor correction circuits in accordance with embodiments of the present disclosure are not limited to a 2-stage configuration. FIGS. 5 and 6 depict two exemplary 3-stage configurations in accordance with certain embodiments of the present disclosure. More specifically, as depicted in FIG. 5, the first stage 502 utilizes a simple slicer to provide the first stage estimation, the second stage 504 applies post-cursor correction to the output from the first stage, and the third stage 506 subsequently applies post- and pre-cursor corrections to the output from the second stage. Alternatively, as depicted in FIG. 6, the second stage 504A can be configured to apply post- and pre-cursor corrections, which can be more complex but provides improved accuracy. It is understood that the 3-stage configurations described above are merely exemplary. Additional stages can be utilized without departing from the spirit and scope of the present disclosure.

Utilizing multi-stage interleaving techniques as described above results in parallelization of processing which naturally supports pre-cursor compensation with estimates of the future bit and in addition, provides sufficient time to process the operation. As stated earlier, this allows for a better performing and low power baud rate CDR to be used due to symmetrical ISI cancellation with respect to the cursor. It results with better "eye" margins and provides better "eye" centering.

In addition, multi-stage interleaving also improves the bit error ratio (BER) of the final stage. BER of the final stage depends on the quality of the estimate in the earlier stage(s). Mathematical analysis and simulations show that the BER of a follow-on stage is better than that of the previous stage. Further, for most channels, this multi-stage interleaved track and hold configuration achieves better performance than a traditional DFE even without a DFE in the first stage (e.g., using a simple slicer instead) which makes this solution very attractive since complexity of DFE implementation is very high and may even be prohibitive at higher data rates.

As mentioned previously, the intersymbol interference correction circuits in accordance with embodiments of the present disclosure can be incorporated into serializer-deserializer (SerDes) receivers, SerDes transceivers, or SerDes products in general, to provide such receivers/transceivers abilities to compensate for not only post-cursor intersymbol interference, but also pre-cursor intersymbol interference. It is contemplated that such an intersymbol interference correction circuit can be fabricated in an integrated circuit and can also be incorporated in to any communication apparatus that receives serial data without departing from the spirit and scope of the present disclosure.

Figure 7:
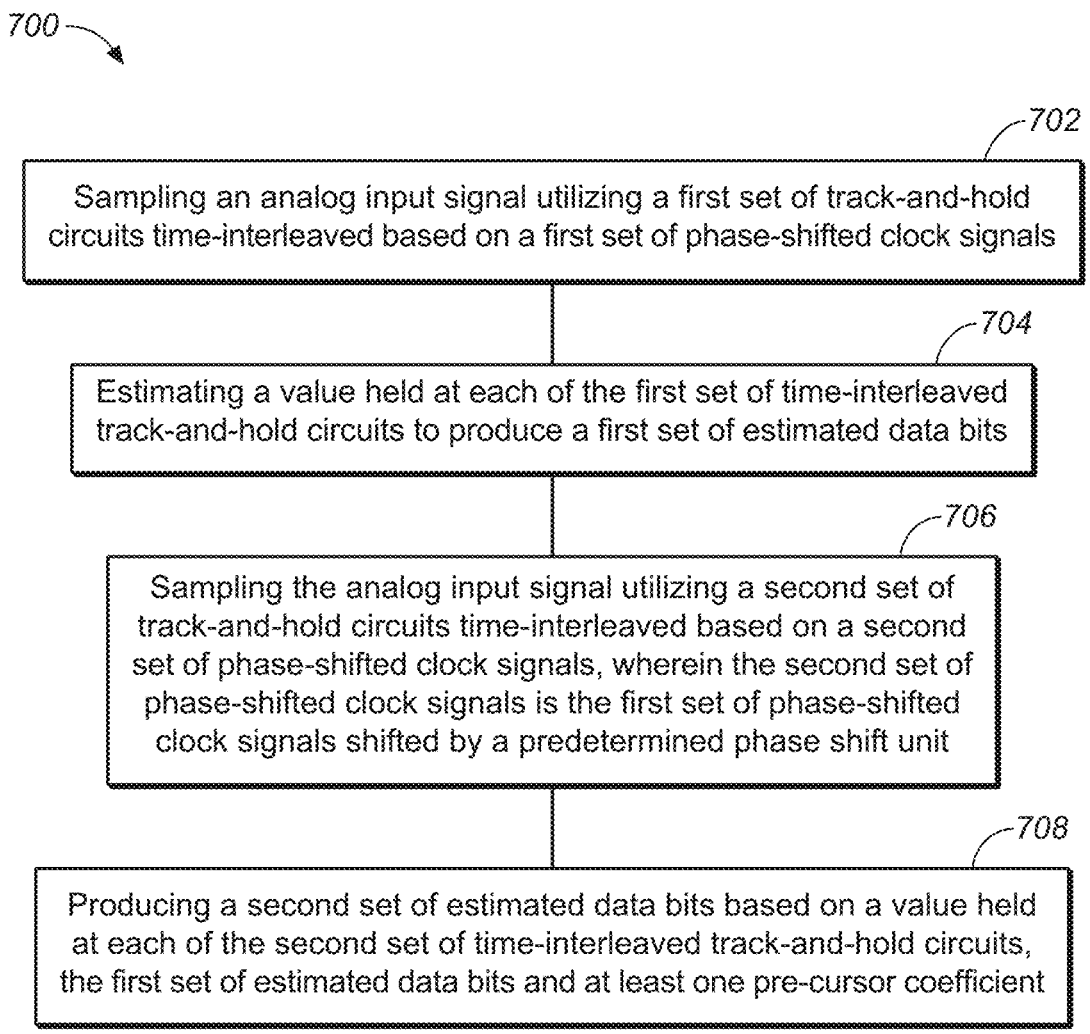
FIG. 7 is a flow diagram illustrating a method for intersymbol interference correction.

Referring to FIG. 7, a method 700 for correcting pre-cursor intersymbol interference in a receiver is shown. Upon receiving an analog input signal, the input signal is sampled in a first stage according to N clock signals into N time-interleaved signals in step 702. Interleaving is achieved by sampling the sample input with clocks of different phases. In one embodiment, the clock signals are of $$\frac{1}{N}$$

data rate, shifted by 1T, where 1T is time of one bit in the transmission channel $$\left(\text{i.e., } \frac{1}{\text{data rate}}\right).$$

Each one of the N time-interleaved signals is then fed to a corresponding track and hold circuit, which tracks (samples) and holds the value of its received signal at a constant level for up to N units of time. The N output signals from the track and hold circuits can then be provided for further processing in order to provide the first stage estimations in step 704.

As previously described, the first stage estimation can be provided utilizing a simple slicer and/or a decision equalizer. The decisions estimated by the first stage are then provided to at least one subsequent stage for further refinement, and more particularly, at least one of the subsequent stages is configured to apply the pre-cursor correction technique described above.

The subsequent stage also samples the input signal according to N clock signals into N time-interleaved signals in step 706. It is noted, however, that the interleaving clock phases in the second stage are shifted from the first stage clock phases by one (1) unit of interval so as to provide a flip-flop type of operation. This phase shifting allows each particular input signal to be made available in both latched samples in the first stage and the second stage for a period of time, which in turn allows pre-cursor correction to be applied in step 708 to generate reasonable estimates of incoming samples to correct pre-cursor intersymbol interferences as previously described.

As previously described, it is contemplated that the number of processing stages is not limited to two. Additional stages can be utilized without departing from the spirit and scope of the present disclosure, and each subsequent stage may be configured to apply post- and/or pre-cursor corrections to improve estimation accuracy. The specific number of stages utilized for a particular receiver may vary based on communication channel noise characteristics, precision level, data rate, as well as other factors.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A receiver, comprising:
    a first set of time-interleaved track-and-hold circuits configured to sample an input signal according to a first set of phase-shifted clock signals;
    a first estimation module configured to estimate a value held at each of the first set of time-interleaved track-and-hold circuits to produce a first set of estimated data bits;
    a second set of time-interleaved track-and-hold circuits configured to sample the input signal according to a second set of phase-shifted clock signals, wherein the second set of phase-shifted clock signals is the first set of phase-shifted clock signals shifted by a predetermined phase shift unit; and
    a second estimation module configured to produce a second set of estimated data bits based on a value held at each of the second set of time-interleaved track-and-hold circuits, the first set of estimated data bits and at least one pre-cursor coefficient.

2. The receiver of claim 1, wherein the second set of phase-shifted clock signals is the first set of phase-shifted clock signals shifted by one phase shift unit.

3. The receiver of claim 1, wherein the first estimation module is a simple slicer.

4. The receiver of claim 1, wherein the first estimation module is a 1-tap decision feedback equalizer.

5. The receiver of claim 1, wherein the receiver is a serializer-deserializer receiver.

6. The receiver of claim 5, wherein output signals from the receiver are provided as input signals to a clock and data recovery block.

7. The receiver of claim 6, wherein the clock and data recovery block is a baud-rate clock and data recovery block.

8. A communication apparatus, comprising:
a first estimation module configured to sample an input signal to produce a first set of estimated data bits; and
a second estimation module configured to sample the input signal phase shifted by a predetermined phase shift unit to produce a second set of estimated data bits, wherein the second set of estimated data bits are produced at least partially based on the first set of estimated data bits and at least one pre-cursor coefficient,
wherein the first estimation module includes a first set of time-interleaved track-and-hold circuits, the first set of time-interleaved track-and-hold circuits configured to sample the input signal according to a first set of phase-shifted clock signals, wherein the second estimation module includes a second set of time-interleaved track-and-hold circuits, the second set of time-interleaved track-and-hold circuits configured to sample the input signal according to a second set of phase-shifted clock signals, and wherein the second set of phase-shifted clock signals is the first set of phase-shifted clock signals shifted by the predetermined phase shift unit.

9. The apparatus of claim 8, wherein the second set of phase-shifted clock signals is the first set of phase-shifted clock signals shifted by one phase shift unit.

10. The apparatus of claim 8, wherein the second set of estimated data bits is provided as input signals to a clock and data recovery block.

11. The apparatus of claim 8, wherein the first estimation module and the second estimation module are integrated components of at least one of: a receiver and a transceiver.

12. The apparatus of claim 8, wherein the first estimation module and the second estimation module are integrated components of at least one of: a serializer-deserializer receiver and a serializer-deserializer transceiver.

13. The apparatus of claim 8, wherein the first estimation module includes a simple slicer.

14. The apparatus of claim 8, wherein the first estimation module includes a 1-tap decision feedback equalizer.

15. The apparatus of claim 8, further comprising:
a third estimation module configured to sample the input signal further phase shifted by the predetermined phase shift unit to produce a third set of estimated data bits, wherein the third set of estimated data bits are produced at least partially based on the second set of estimated data bits and at least one pre-cursor coefficient.

16. A method for correcting intersymbol interference, the method comprising:
sampling an input signal utilizing a first set of track-and-hold circuits time-interleaved based on a first set of phase-shifted clock signals;
estimating a value held at each of the first set of time-interleaved track-and-hold circuits to produce a first set of estimated data bits;
sampling the input signal utilizing a second set of track-and-hold circuits time-interleaved based on a second set of phase-shifted clock signals, wherein the second set of phase-shifted clock signals is the first set of phase-shifted clock signals shifted by a predetermined phase shift unit; and
producing a second set of estimated data bits based on a value held at each of the second set of time-interleaved track-and-hold circuits, the first set of estimated data bits and at least one pre-cursor coefficient.

17. The method of claim 16, wherein estimated value $\hat{x}'_k$ of a particular data bit k in the second set of estimated data bits $\{\hat{x}'\}$ is produced at least partially based on estimated value $\hat{x}_{k+1}$ of a subsequent data bit k+1 in the first set of estimated data bits $\{\hat{x}\}$ and the at least one pre-cursor coefficient.

18. The method of claim 16, wherein the second set of phase-shifted clock signals is the first set of phase-shifted clock signals shifted by one phase shift unit.

19. The method of claim 16, wherein the first set of estimated data bits is estimated utilizing at least one of: a simple slicer and a 1-tap decision feedback equalizer.

20. The method of claim 16, further comprising:
sampling the input signal utilizing a third set of track-and-hold circuits time-interleaved based on a third set of phase-shifted clock signals, wherein the third set of phase-shifted clock signals is the second set of phase-shifted clock signals further shifted by the predetermined phase shift unit; and
producing a third set of estimated data bits based on a value held at each of the third set of time-interleaved track-and-hold circuits, the second set of estimated data bits and at least one pre-cursor coefficient.

* * * * *